United States Patent
Bu et al.

(10) Patent No.: US 6,677,201 B1
(45) Date of Patent: Jan. 13, 2004

(54) METHOD OF FABRICATING THERMAL CVD OXYNITRIDE AND BTBAS NITRIDE SIDEWALL SPACER FOR METAL OXIDE SEMICONDUCTOR TRANSISTORS

(75) Inventors: Haowen Bu, Plano, TX (US); Amitabh Jain, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/261,407

(22) Filed: Oct. 1, 2002

(51) Int. Cl.[7] .............................................. H01L 21/336
(52) U.S. Cl. ........................ 438/257; 438/786; 438/303
(58) Field of Search ................................ 438/257–267, 438/301, 305, 786, 197

(56) References Cited

U.S. PATENT DOCUMENTS

| | | | |
|---|---|---|---|
| 5,793,089 A | * | 8/1998 | Fulford et al. .............. 257/408 |
| 5,930,627 A | * | 7/1999 | Zhou et al. ................. 438/257 |
| 5,948,701 A | * | 9/1999 | Chooi et al. ................ 438/694 |
| 6,399,493 B1 | * | 6/2002 | Dawson et al. ............. 438/682 |
| 6,468,915 B1 | * | 10/2002 | Liu ............................. 438/706 |
| 6,479,350 B1 | * | 11/2002 | Ling et al. .................. 438/265 |
| 6,562,676 B1 | * | 5/2003 | Ju ............................... 438/232 |
| 2002/0076877 A1 | * | 6/2002 | Gupta et al. ................ 438/230 |
| 2002/0137268 A1 | * | 9/2002 | Pellerin et al. ............. 438/197 |

FOREIGN PATENT DOCUMENTS

JP          11-163163      *   6/1999

* cited by examiner

*Primary Examiner*—Amir Zarabian
*Assistant Examiner*—Khanh Duong
(74) *Attorney, Agent, or Firm*—Peter K. McLarty; W. James Brady, III; Frederick J. Telecky, Jr.

(57) ABSTRACT

A method for using CVD oxynitride and BTBAS nitride during the sidewall formation process in MOS transistor fabrication processes. A silicon oxynitride layer (110) and a silicon nitride layer (120) are used to form sidewalls for MOS transistors. The silicon nitride layer (120) is formed using BTBAS processes.

7 Claims, 4 Drawing Sheets

METHOD OF FABRICATING THERMAL CVD OXYNITRIDE AND BTBAS NITRIDE SIDEWALL SPACER FOR METAL OXIDE SEMICONDUCTOR TRANSISTORS

FIELD OF THE INVENTION

The invention is generally related to the field of MOSFET transistors and more specifically to a novel process to reduce the junction depth of the source and drain extension regions.

BACKGROUND OF THE INVENTION

Shown in FIG. 1 is a cross-sectional diagram of a typical metal oxide semiconductor (MOS) transistor 5. The MOS transistor 5 is fabricated in a semiconductor substrate 10. The MOS transistor comprises a gate dielectric layer 20 that is formed on the surface of the substrate 10. Typically this gate dielectric layer is formed using silicon oxide or nitrided silicon oxide although many other materials such as silicates have been used. The MOS transistor gate structure 30 is formed on the gate dielectric layer 20 land is typically formed using polycrystalline silicon. In addition to polycrystalline silicon other materials such as metals have been used to form the transistor gate. The combined dielectric layer/gate structure is often referred to as the gate stack. Following the formation of the transistor gate stack the source-drain extension regions 40 are formed using ion implantation. In forming these extension regions 40 dopants are implanted into the 'substrate using the gate stack as a mask. Therefore the extension regions 40 are aligned to the gate stack in what is known as the self-aligned process. Following the formation of the extension regions 40, sidewall structures 50 are formed adjacent to the gate stack. These sidewall structures 50 are typically formed by depositing one or more conformal films on the surface of the substrate followed by an anisotropic etch process. This anisotropic etch will remove the conformal film[s] from all regions of the surface except those adjacent to gate stack structures. This results in the sidewall structures 50 shown in FIG. 1. Following the formation of the sidewall structures the source and drain regions 60 are formed using ion implantation. The structure is then annealed at a high temperature to activate the implanted dopant species in both the extension regions 40 and the source and drain regions 60. During this high temperature anneal the dopants will diffuse into the semiconductor substrate. This dopant diffusion will result in a final junction depth of $x_j$ for the extension regions 40.

As MOS transistor dimensions are reduced there is a need to reduce the junction depth $x_j$ of the extension regions 40. Typically this is accomplished by reducing the implantation dose and energy of the dopant species used to form the extension regions 40. This often leads to an increase in the drain land source resistance of the MOS transistor resulting in a degrading of the MOS transistor performance. There is therefore a need to reduce the extension junction depth $x_j$ without degrading MOS transistor performance.

SUMMARY OF THE INVENTION

The instant invention describes a method for forming thermal CVD oxynitride and BTBAS nitride sidewall spacers during MOS transistor fabrication. In particular a gate stack is formed on a semiconductor substrate. An optional offset spacer is formed adjacent to the gate stack before the formation of extension regions. The sidewall structure is formed using silicon oxynitride layers and silicon nitride layers formed over the gate stack and the silicon substrate. The atomic nitrogen concentration in the silicon oxynitride layer is between 2 to 15 atomic percent. In a further embodiment of the instant invention the sidewall structures will comprise alternating layers of silicon oxide and silicon nitride.

Technical advantages of the instant invention include a reduction in the boron diffusion obtained during thermal annealing cycles. Other technical advantages will be readily apparent to one skilled in the art from the following figures, description, and claims.

Figure 1:
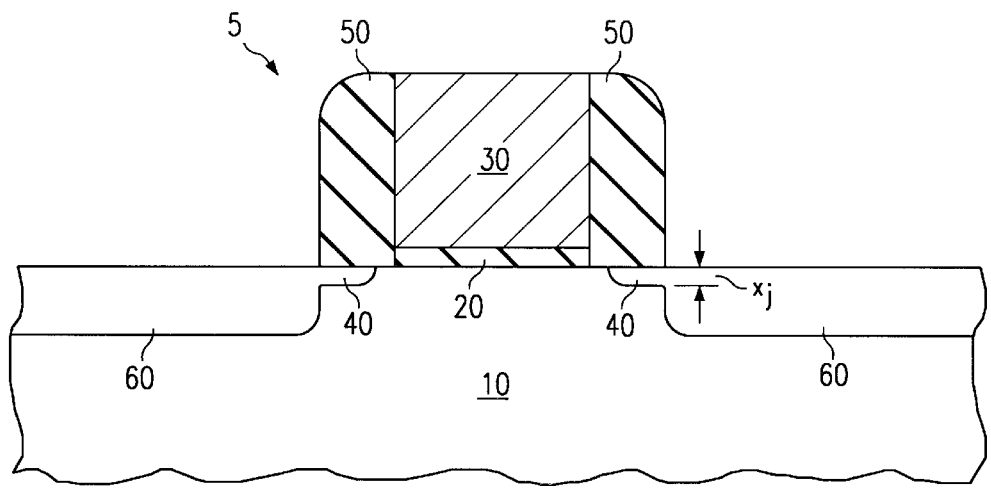
FIG. 1 is a cross-sectional diagram of a MOS transistor.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 2(a)–2(d), the instant invention can be utilized in any semiconductor device structure. For example the instant invention can be used to form the source drain region prior to forming the source and drain extension regions. Thos process is often referred to as a disposable sidewall process. The methodology of the instant invention provides a solution to obtaining ultra-shallow extension regions for improved CMOS transistor performance.

Figure 2A:
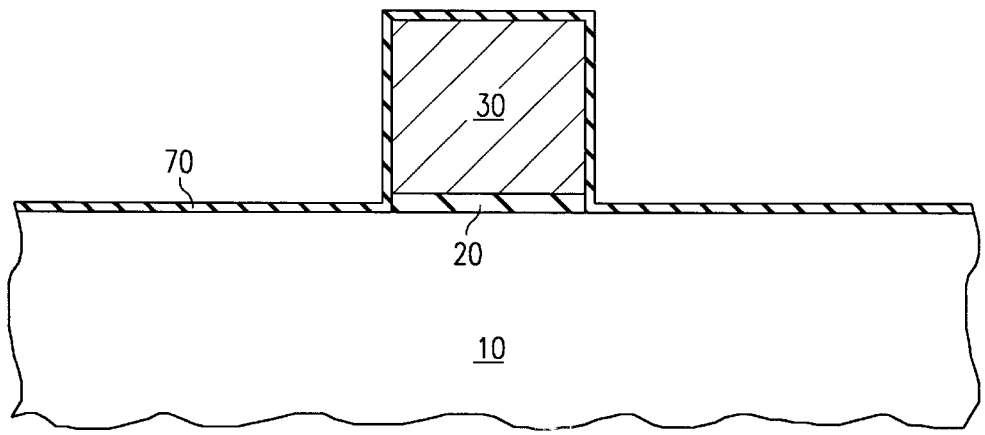
FIGS. 2(a)–(d) are cross-sectional diagrams illustrating the formation of a MOS transistor at various steps in an embodiment of the instant invention.

As shown in FIG. 2(a) the MOS transistors of the instant inventions are fabricated on a semiconductor substrate 10. In an embodiment of the instant invention the substrate 10 is a silicon substrate with or without an epitaxial layer. The MOS transistors of the instant invention can also be formed on silicon-on-insulator substrates that contain a buried insulator layer. The MOS transistors are fabricated in n-type or p-type well regions that are formed in the substrate 10. These n-type or p-type well regions have been omitted from the Figures for clarity.

In forming the MOS transistors of the instant invention, a gate dielectric region 20 is formed on the substrate 10. The gate dielectric region 20 can be formed using silicon oxide, silicon oxynitride, alternating layers of silicon oxide and silicon nitride, or any suitable dielectric material. Following the formation of the gate dielectric layer 20, a blanket layer of polycrystalline silicon, a metal, or any suitable material is formed on the gate dielectric layer 20. Photolithography and dry etching techniques are then used to pattern and etch the blanket layer to form the transistor gate 30. The dielectric layer 20 and gate 30 will be referred to as the gate stack. Following the formation of a gate stack where polycrystalline silicon is used to form the transistor gate 30, an oxidation process or a chemical vapor deposition (CVD) process is performed to grow the layer of silicon oxide 70 shown in FIG. 2(a). In an embodiment of the instant invention the silicon oxide layer 70 will be between 10Å and 70Å thick.

Figure 2B:
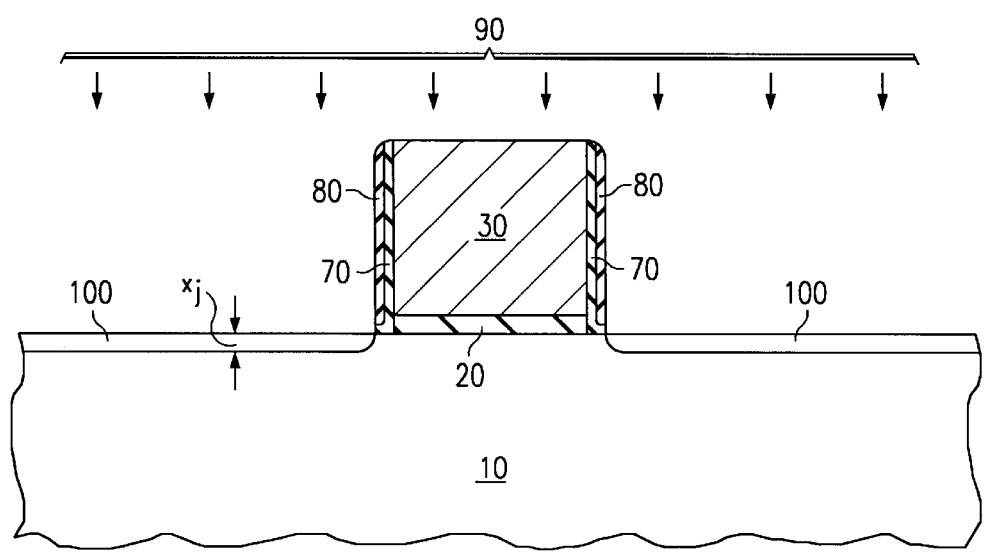

Following the formation of the silicon oxide layer 70, optional offset spacer structures 80 are formed as shown in FIG. 2(b). In an embodiment of the instant invention the offset spacer structures 80 are formed by first depositing a conformal layer of silicon nitride over the silicon oxide layer 70. An anisotropic dry etch process is then used to remove certain regions of the silicon nitride layer resulting in the sidewall spacer structures 80. Source-drain extension (extension) regions 100 are then formed in the substrate 10 by the ion implantation of various dopant species 90. The as implanted extension regions 100 (i.e. prior to any high temperature thermal annealing) will be aligned to the edge of the sidewall spacer structures 80. For PMOS transistors the implantation process can comprise a single or multiple implantation steps using p-type dopants such as boron and $BF_2$. In addition other implants such as those used to form the pocket regions can also be performed at this time. For NMOS transistors the implantation process can comprise a single or multiple implantation steps using n-type dopants such as arsenic and phosphorous. Other implants such as those used to form the pocket regions can also,be performed at this time. It is extremely important to achieve shallow junction depths $X_j$ in the extension regions 100. To achieve these shallow junction depths, the implanted dopant should be placed close to the surface of the substrate 10 to allow for dopant diffusion during, the subsequent high temperature anneal. The high temperature anneal process is typically a rapid thermal annealing (RTA) process. The increase of the as implanted extension junction depth during the high anneal is reduced using the methodology of the instant invention.

Figure 2C:
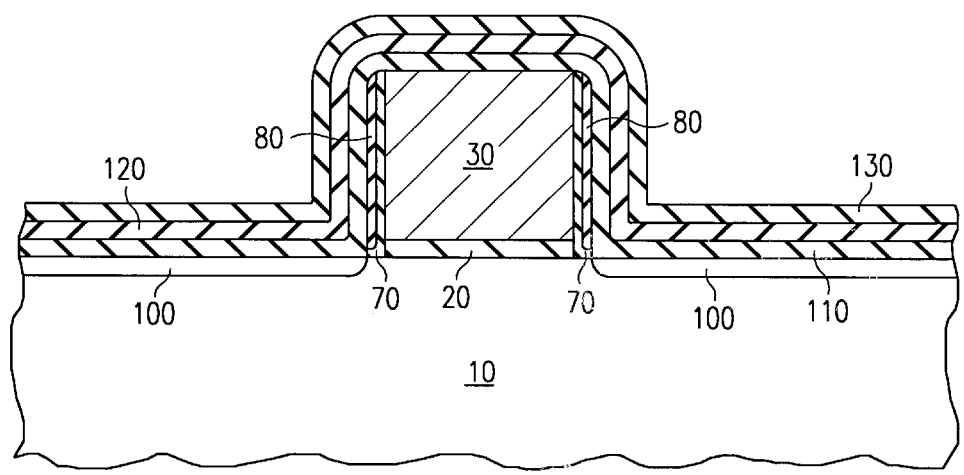

Following the formation of the extension regions 100 and prior to any high temperature annealing, a number of layers are formed on the structure of FIG. 2(b). In an embodiment of the instant invention three layers are formed as shown in FIG. 2(c). The first layer 110 is a silicon oxynitride layer with an atomic nitrogen concentration of 2 to 15 atomic percent and preferably less than 5 atomic percent. The atomic nitrogen can be distributed throughout the silicon oxynitride layer 110 or can be at the silicon oxynitride film 110/semiconductor substrate 10 interface. The silicon oxynitride layer 110 can be formed using $SiH_4$ or $Si_2H_6$, $NH_3$, and $N_2O$ in a chemical vapor deposition (CVD) process. In particular at temperatures between 600° C. and 750° C., 2–20 sccm of $SiH_4$, 50–300 sccm of $N_2O$, and 1000–5000 sccm of $NH_3$ can be used to form the oxynitride layer. This process can be performed in a single wafer heater based or rapid thermal type chamber or a conventional batch furnace. Following the formation of the oxynitride layer 110, a silicon nitride layer 120 is formed. In an embodiment of the instant invention the silicon nitride layer 120 is formed using a CVD bis t-ButylaminoSilane (BTBAS) process. In this process BTBAS ($SiH_2(t-BuNH)_2$) along with $NH_3$ and other gases such as nitrogen are used to deposit the silicon nitride layer 120 at temperatures between 475° C. and 650° C. Following the formation of the silicon nitride layer 120, a silicon oxide layer 130 is formed. In an embodiment of the instant invention the silicon oxide layer 130 is formed using a single wafer chemical vapor deposition process at temperatures between 550° C. and 750° C.

Figure 3:
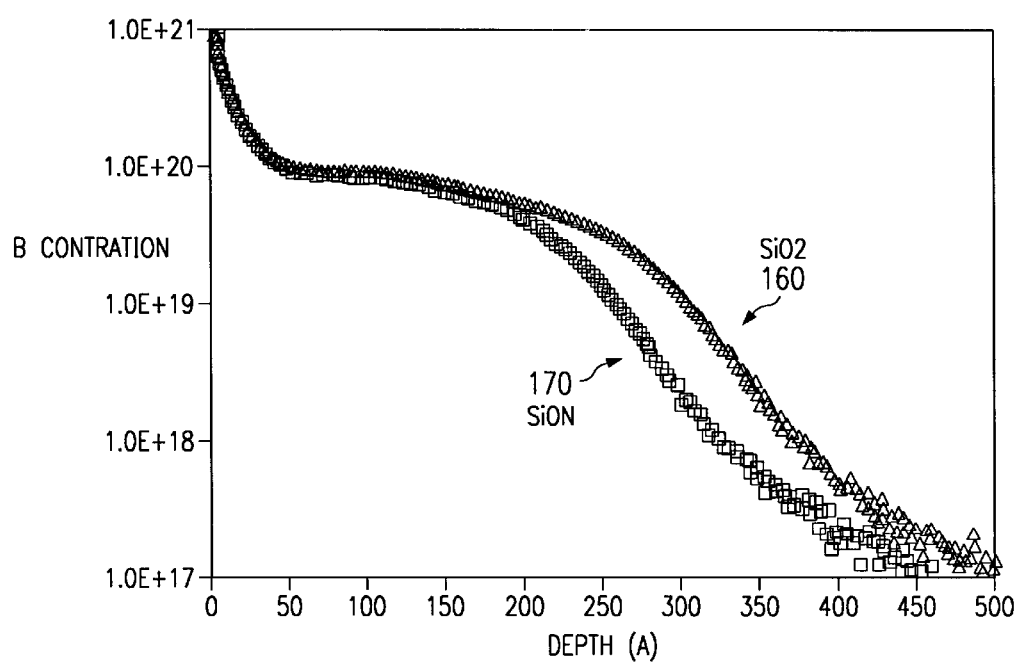
FIG. 3 is a plot of boron concentration versus depth after implementation of the instant invention.
Figure 2D:
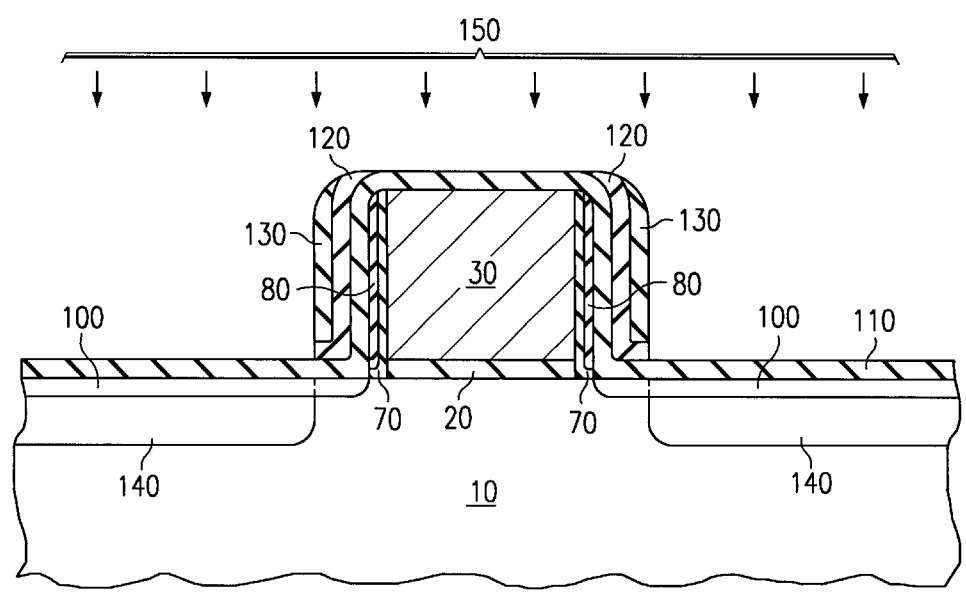

As shown in FIG. 2(d) regions of the layers 120 and 130 are removed to form sidewall structures. In an embodiment of the instant invention anisotropic silicon oxide and silicon nitride etch processes are used to remove the unwanted regions of layers 120 and 130. Following the sidewall formation process the extension regions 100 are still covered by the silicon oxynitride layer 110 even through some of this layer might be lost during the anisotropic silicon nitride etch process. After the sidewall formation process an optional thermal anneal can be performed. The source and drain regions 140 are then formed by implanting dopant species 150 into the substrate. For PMOS transistors the implantation process can comprise a single or multiple implantation steps using p-type dopants such as boron and/or $BF_2$. For NMOS transistors the implantation process can comprise a single or multiple implantation steps using n-type dopants such as arsenic and/or phosphorous. Following the implantation of the source drain regions 140 a high temperature anneal is performed to activate the implanted dopants. In a particular embodiment the high temperature anneal comprises a 1000° C. to 1100° C. rapid thermal anneal. During the anneal boron diffusion in the extension regions 100 is reduced. This is illustrated in FIG. 3 where the boron profile obtained after implementation of the instant invention is shown. In FIG. 3 the boron profile obtained using silicon oxide to form layer 110 is shown by line 160. This is to be compared with the boron profile 170 obtained using silicon oxynitride to form layer 110. The reduction in boron diffusion is clearly shown in the Figure.

Figure 4:
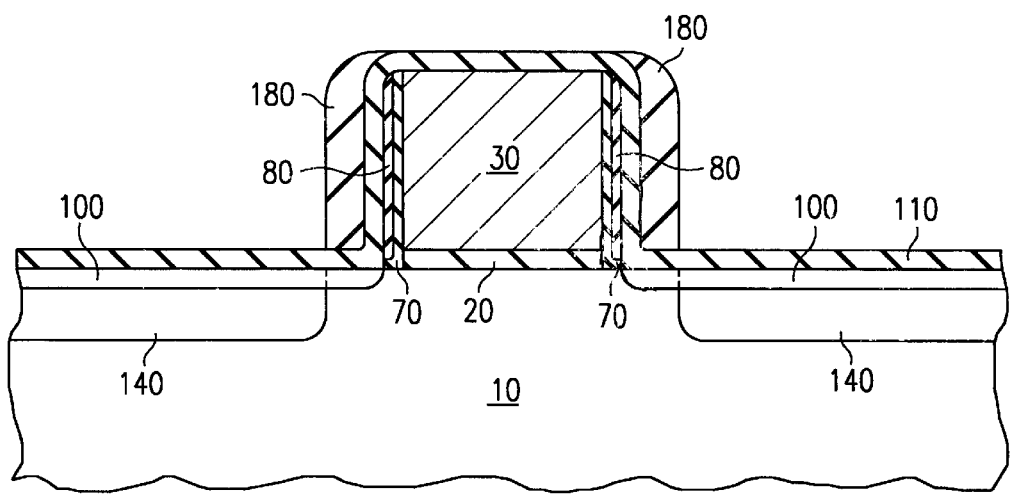
FIG. 4 is a cross section diagram illustrating a further embodiment of the instant invention.

Shown in FIG. 4 is a further embodiment of the instant invention. In this embodiment the oxynitride layer 110 is formed as described above with a CVD process comprising $SiH_4$ or $Si_2H_6$, $N_2O$, and $NH_3$. Following the formation of the oxynitride layer 110, a single silicon nitride layer is formed. This layer can be formed using the BTBAS process described above or any other suitable technique. The silicon nitride layer is then etched to form the silicon nitride sidewall structure 180 shown in FIG. 4. The source and drain regions 140 are then formed as described above. Following the formation of the source and drain regions 140 the implanted regions are annealed as described above.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for fabricating a MOS transistor, comprising:

providing a semiconductor substrate;

forming a gate stack on said semiconductor substrate;

forming extension regions in said semiconductor substrate adjacent to said gate stack;

forming a contiguous silicon oxynitride layer over said gate stack and said extension regions;

forming a contiguous silicon nitride layer on said contiguous silicon oxynitride layer;

etching said contiguous silicon oxynitride layer and said contiguous silicon nitride layer to form sidewall structures on opposite sides of said gate stack;

forming source and drain regions in said semiconductor substrate adjacent to said sidewall structures; and annealing said extension and source and drain regions.

2. The method of claim 1 wherein said silicon oxynitride layer has an atomic nitrogen concentration of 2 to 10 atomic percent.

3. The method of claim 2 further comprising forming offset sidewall spacers adjacent to said gate stack.

4. A method for fabricating an integrated circuit transistor, comprising:

providing a semiconductor substrate;

forming a gate stack on said semiconductor substrate;

forming a first silicon oxide layer on said gate stack;

forming extension regions in said semiconductor substrate adjacent to said gate stack;

forming a contiguous silicon oxynitride layer on said gate stack and said extension regions;

forming a contiguous silicon nitride layer on said contiguous silicon oxynitride layer;

forming a contiguous silicon oxide layer on said contiguous silicon nitride layer;

etching said contiguous silicon oxide layer and said contiguous silicon nitride layer to form sidewall structures on opposite sides of said gate stack;

forming source and drain regions in said semiconductor substrate adjacent to said sidewall structures; and annealing said extension regions and said source and drain regions.

5. The method of claim 4 wherein said oxynitride layer has a nitrogen concentration of 2 to 10 atomic percent.

6. The method of claim 5 wherein said contiguous silicon nitride layer is formed using a CVD process comprising BTBAS and $NH_3$.

7. The method of claim 4 further comprising forming offset sidewall spacer structures adjacent to said gate stack.

* * * * *